(12) United States Patent
Ozanne

(10) Patent No.: US 9,966,478 B2
(45) Date of Patent: May 8, 2018

(54) METHOD FOR PLATING A PHOTOVOLTAIC CELL AND PHOTOVOLTAIC CELL OBTAINED BY SAID METHOD

(71) Applicant: COMMISSARIAT À L'ENERGIE ATOMIQUE ET AUX ENERGIES ALTERNATIVES, Paris (FR)

(72) Inventor: Fabien Ozanne, Allevard (FR)

(73) Assignee: COMMISSARIAT À L'ENERGIE ATOMIQUE ET AUX ENERGIES ALTERNATIVES, Paris (FR)

( * ) Notice: Subject to any disclaimer, the term of this patent is extended or adjusted under 35 U.S.C. 154(b) by 0 days. days.

(21) Appl. No.: 14/427,526

(22) PCT Filed: Sep. 6, 2013

(86) PCT No.: PCT/FR2013/000230
§ 371 (c)(1),
(2) Date: Mar. 11, 2015

(87) PCT Pub. No.: WO2014/041257
PCT Pub. Date: Mar. 20, 2014

(65) Prior Publication Data
US 2015/0249163 A1    Sep. 3, 2015

(30) Foreign Application Priority Data
Sep. 11, 2012    (FR) ...................................... 12 02414

(51) Int. Cl.
*H01L 31/02* (2006.01)
*H01L 31/0224* (2006.01)
*H01L 31/18* (2006.01)

(52) U.S. Cl.
CPC .................. *H01L 31/02008* (2013.01); *H01L 31/022425* (2013.01); *H01L 31/022433* (2013.01); *H01L 31/188* (2013.01); *Y02E 10/50* (2013.01)

(58) Field of Classification Search
CPC ......... H01L 31/0224; H01L 31/022425; H01L 31/022433; H01L 31/05; H01L 21/0425;
(Continued)

(56) References Cited

U.S. PATENT DOCUMENTS

2008/0121276 A1* 5/2008 Lopatin ........... H01L 31/022425
136/256
2008/0299297 A1* 12/2008 Cousins ............ H01L 21/76802
427/74
(Continued)

FOREIGN PATENT DOCUMENTS

DE    102007003682 A1    8/2008
EP    2184787 A1    5/2010
(Continued)

OTHER PUBLICATIONS

Boulord et al; "Comparison of different electrochemical deposits for contact metallization of silicon solar cells;" Materials Science and Engineering B, Elsevier Sequoia, Lausanne, CH; Nov. 25, 2009; vol. 165; No. 1-2; pp. 53-56.
(Continued)

*Primary Examiner* — Devina Pillay
*Assistant Examiner* — Daniel P Malley, Jr.
(74) *Attorney, Agent, or Firm* — Oliff PLC

(57) ABSTRACT

A method for producing at least one electric contact by electrochemical deposition of an electrically conducting material on a face of a photovoltaic cell, the contact being formed by first and second lines connected to one another, the second line presenting a larger width than the width of
(Continued)

the first line, the method including, before electrochemical deposition, a formation step of at least one area presenting a lower electric conductivity than the electric conductivity of the electrically conducting material, on a part of the face of the photovoltaic cell designed to be electrically connected with the second line, at the level of its intersection with the first line.

22 Claims, 5 Drawing Sheets

(58) Field of Classification Search
CPC ......... H01L 21/22; H01L 21/28; H01L 21/31; H01L 21/38; H01L 21/44; H01L 21/441; H01L 21/46; H01L 21/4763; H01L 28/60; H01L 28/75; H01L 29/40; H01L 51/445
See application file for complete search history.

(56) References Cited

U.S. PATENT DOCUMENTS

| | | | | |
|---|---|---|---|---|
| 2010/0124619 A1* | 5/2010 | Xu | ......................... | C23C 18/161 427/554 |
| 2011/0011745 A1* | 1/2011 | Ji | ........................... | C25D 7/126 205/91 |
| 2011/0100453 A1* | 5/2011 | Clevenger | ......... | H01L 31/02164 136/256 |
| 2011/0120530 A1* | 5/2011 | Isaka | ................. | B32B 17/10018 136/251 |
| 2012/0132273 A1* | 5/2012 | Lee | ................. | H01L 31/022425 136/256 |

FOREIGN PATENT DOCUMENTS

| | | | | |
|---|---|---|---|---|
| EP | | 2482327 A2 | 8/2012 | |
| WO | WO 2010137854 A2 * | | 12/2010 | ..... H01L 31/022425 |

OTHER PUBLICATIONS

Tous et al; "Electroless nickel deposition and silicide formation for advanced front side metallization of industrial silicon solar cells;" Energy Procedia; Oct. 25, 2011; vol. 21; pp. 39-46.

Beaucarne et al; "Summary of the third workshop of metallization for crystalline silicon solar cells;" Energy Procedia; May 2, 2012; vol. 21; pp. 2-13.

Berger et al; "International technology roadmap for photovoltaics (IPRPV);" Semi PV Group; Mar. 2012; 3rd. Ed.

Notarp; "Control of nickel silicide formation using porous silicon in direct plating concepts for silicon solar cell front side metallization;" NB Technologies Consulting Engineers; 3rd Workshop on Metallization for Crystalline Silicon Solar Cells, Charleroi, Belgium; Oct. 25-26, 2011.

21.4% Silicon Solar Cells with Fully Plated Nickel-Copper Metallization, 3rd Workshop on Metallization for Crystalline Silicon Solar Cells, 2011.

* cited by examiner

METHOD FOR PLATING A PHOTOVOLTAIC CELL AND PHOTOVOLTAIC CELL OBTAINED BY SAID METHOD

BACKGROUND OF THE INVENTION

The invention relates to a method for making at least one electric contact by electrochemical deposition of an electrically conducting material on a face of a photovoltaic cell as well as to a photovoltaic cell obtained in this way.

STATE OF THE ART

One of the steps involved in producing photovoltaic cells is metallization of the photovoltaic cells. This metallization takes place towards the end of the production method of the photovoltaic cells and it consists in depositing metal contacts, generally in the form of combs or of a grid, or in the form of a lattice or network, on at least one of the faces of the cell. These metal contacts are designed to collect the current and to interconnect the cells to one another.

As represented in FIGS. 1 and 2, photovoltaic cell 1 comprises at least one main surface 2 covered by an electric contact in the form of a grid 3 composed of first lines 4 and second lines 5 also called busbars. Busbars 5 are wider than first lines 4 and they are perpendicular to first lines 4. All the busbars 5 are parallel to one another and all the first lines 4 are parallel to one another.

The major metallization technique is screen printing and the metal contacts are more often than not made from silver. This technique does however present a certain number of limitations, such as for example a high resistivity of the electric contact and a large width of the lines. The width of the lines is generally about 70 to 120 µm, which causes a substantial shadow factor on the face of the cell thereby reducing the efficiency of the cell.

Furthermore, as presented in the document "International Technology Roadmap for Photovoltaics (ITRPV)" (Third Edition March 2012), one of the objectives in the solar field, for the years to come, is to replace silver by copper or any other less expensive metal.

The documents "Control of Nickel silicide formation using porous silicon in direct plating concepts for silicon solar cell front side metallization", "Electroless nickel deposition and silicide formation for advanced front side metallization of industrial silicon solar cells" and "21.4% Silicon Solar Cells with Fully Plated Nickel-Copper Metallization" of the "3rd Workshop on Metallization for Crystalline Silicon Solar Cells" (2011) present metallization methods using electrochemical means. These methods are at present the subject of increasing interest as they present numerous advantages: better electric performances and reduction of the manufacturing cost compared with screen printing. Electrochemical techniques in particular enable silver, commonly used in screen printing, to be replaced by nickel or copper for example.

However, the methods for forming metal contacts by electrochemical means lead to a reduction of the thickness of the contacts and therefore to an increase of the linear resistance, called "line" resistance.

OBJECT OF THE INVENTION

The object of the invention is to remedy the shortcomings of prior art, and in particular to propose a production method of at least one electric contact by electrochemical deposition that is simple, robust and reproducible, and enables a reduction of the line resistance to be obtained.

It is a further object of the invention to propose a photovoltaic cell which presents improved electric performances.

These objects tend to be achieved by the appended claims.

BRIEF DESCRIPTION OF THE DRAWINGS

Other advantages and features will become more clearly apparent from the following description of particular embodiments of the invention given for non-restrictive example purposes only and represented in the appended drawings, in which.

DESCRIPTION OF A PREFERRED EMBODIMENT OF THE INVENTION

The production method concerns fabrication of at least one electric contact 8, by electrochemical deposition of an electrically conducting material on a face of a photovoltaic cell 1, said contact being formed by first 4 and second 5 lines connected to one another, second line 5 presenting a larger width than the width of first line 4.

What is meant by width is one of the two surface dimensions of the line. The width corresponds to the smaller dimension of the surface. The longer dimension corresponds to the length.

What is meant by connected to one another is that the two lines touch one another, the two lines form part of the same pattern. The lines are electrically connected to one another. They form a single contact, i.e. a current can flow from one line to the other. The lines are not electrically insulated from one another by a totally insulating area.

The connection area between the lines is called intersection. The two lines are connected for example in the form of a T or a cross. Preferentially, the two lines are perpendicular or substantially perpendicular to one another. The two lines are defined in one and the same plane parallel to the surface of the substrate.

According to a particular embodiment, the bottom of the two lines is formed by the surface of the substrate.

Advantageously, the lines are formed in a single electrochemical deposition step. They are not superposed on one another, they are substantially at the same level on the substrate.

The width of first line 4 is preferentially comprised between 5 µm and 100 µm. The width of second line 5 is preferentially comprised between 0.1 mm and 1.5 mm.

Figure 1:
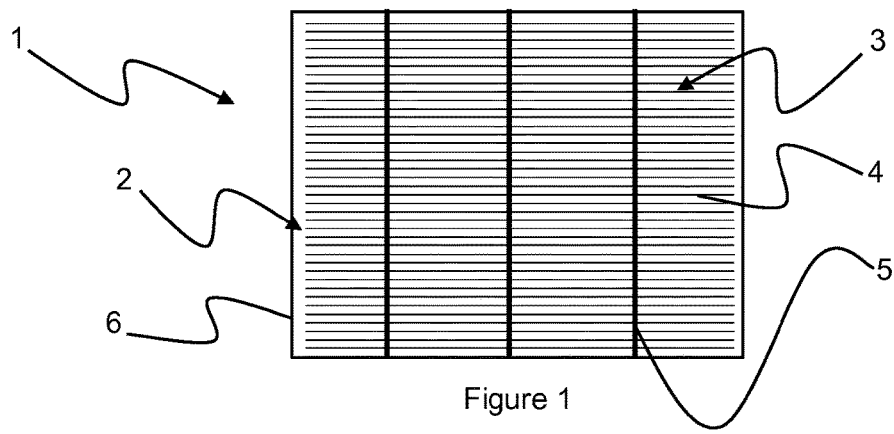
FIG. 1 represents the main face of a photovoltaic cell in schematic manner, the main face being covered by a grid.
Figure 2:
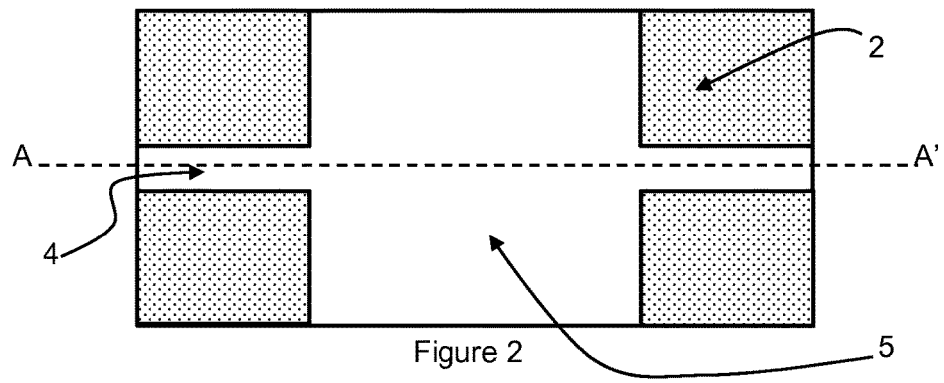
FIG. 2 represents the intersection of two metal lines of different widths on the main face of a substrate, in schematic manner.
Figure 3:
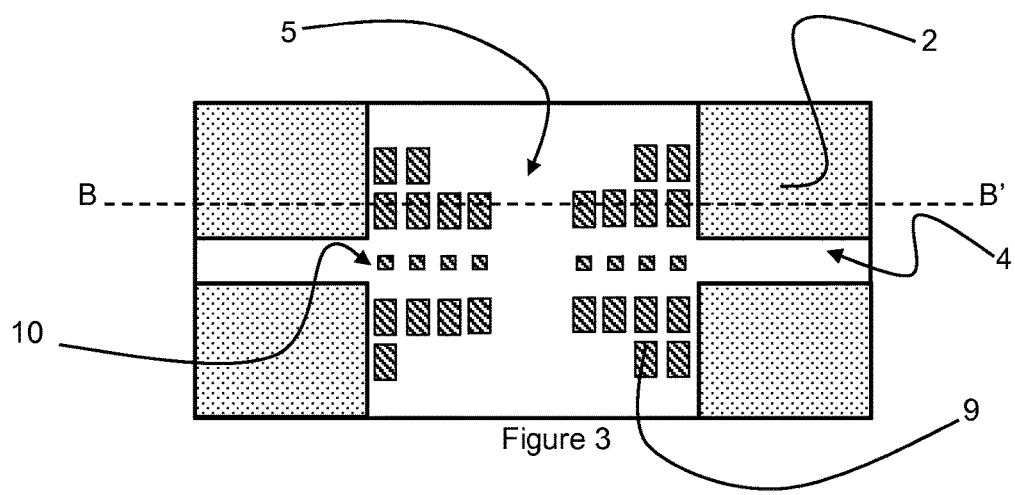
FIGS. 3 and 5 represent a photovoltaic cell according to an embodiment, in schematic manner and in top view.

As represented in FIG. 3, before electrochemical deposition is performed, the method comprises a step of formation of at least one area 9 presenting a lower electric conductivity than the electric conductivity of the electrically conducting material designed to form electric contact 8, on a part of the face of the photovoltaic cell, designed to be electrically connected with second line 5 at the level of its intersection 10 with first line 4, i.e. in proximity to intersection 10 of the lines. Formation of area 9, at intersection 10 of the lines, enables the conductivity to be reduced locally thereby locally modifying the electrochemical deposition rate. This is designed to obtain uniform line heights in proximity to the metallized regions of the photovoltaic cell presenting a large surface compared with the width of the first line.

To perform the metallization method of at least one face of photovoltaic cell 1, a substrate 6, which is advantageously crystalline, i.e. monocrystalline or polycrystalline, is used. Substrate 6 is formed by a semiconductor material, for example a material of type IV, such as Si, Ge, or an alloy of these materials, a material of type III-V or II-VI. Substrate 6 comprises a photovoltaic junction made from semiconductor material. The photovoltaic junction of substrate 6 is for example a junction of p/n type and is made from a semiconductor material such as silicon. It can also be envisaged to use a polymer substrate comprising a photovoltaic junction.

Metallization is performed on at least one of the main faces 2 of substrate 6, i.e. first line 4 and second line 5 are located on at least one of the main faces 2 of substrate 6.

What is meant by main face is that the substrate of photovoltaic cell 1 comprises two opposite main surfaces, and that these are the faces of larger dimensions. At least one of the main faces is an active face. When only one of the main faces of substrate 6 of photovoltaic cell 1 is active, it is the face exposed to the incident electromagnetic radiation, said face generally being called front side.

Photovoltaic cell 1 can be monofacial or bifacial. In the case of a single-sided photovoltaic cell, metallization is advantageously performed on one of the faces only, preferably the face called active face, generally on the front side. In the case of a double-sided photovoltaic cell, metallization can be performed on both the main faces of the photovoltaic cell.

Substrate 6 can also, according to the particular embodiment, comprise an anti-glare layer. The anti-glare layer can for example be formed by silicon nitride, silicon oxide or conducting transparent oxide.

The front side of substrate 6 may if required be textured to improve absorption of the incident radiation.

Preferentially, to make at least one electric contact 8, the method comprises, before the electrochemical deposition step, a step of formation of a mask 7 on said face of the photovoltaic cell. The mask is designed to delineate the position of the electric contact when the electrochemical deposition step is performed. It comprises in particular openings forming a pattern corresponding to that of the electric contact. The electrically conducting material is thus deposited through said mask 7 when the electrochemical deposition step is performed, in order to form electric contact 8 in the form of first 4 and second 5 lines.

Mask 7 thus covers main face 2 and defines a pattern devoid of material.

Preferentially, mask 7 is made from an electrically insulating material. What is meant by electrically insulating material is a material that does not conduct or hardly conducts electric current, i.e. having an electric conductivity close to zero.

The material is preferentially a polymer, and more particularly a resin such as an organic resin that is photosensitive or sensitive to electronic radiation, the latter being exposed so as to form the patterns of mask 7.

According to another embodiment, mask 7 can be made from silicon oxide or from silicon nitride, for example SiN or $SiO_2$.

Mask 7 is deposited on main face 2 of substrate 6 by any suitable technique. For example, mask 7 is formed by photolithography, by screen printing or by deposition of a layer of electrically insulating material on the face of the photovoltaic cell, and by application of a laser beam, or laser patterning, at the surface of said layer to form openings in the layer.

Mask 7 could also be formed from a material of higher resistivity than the material on which it is formed, the latter then being weakly conducting. The electrically conducting material can then deposit both on the surface left free by the openings of the mask and on the latter. Mask 7 and possibly the part of electrically conducting material covering it can be removed by etching once electrochemical deposition has been performed in order to only keep the electrically conducting material, deposited only in the openings of the mask.

Furthermore, as indicated in the foregoing, electrochemical deposition of the electrically conducting material designed to form the electric contact is preceded by a step of formation of at least one area 9 made from a material presenting a lower electric conductivity than the electric conductivity of the electrically conducting material. Area 9 is formed on the part of the face of the photovoltaic cell designed to be electrically connected with second line 5 at the level of its intersection 10 with the first line.

Preferentially, area 9 is made from a more resistive material than the material of the surface on which it is deposited: the material in question has a lower conductivity than that of the material on which it is deposited.

The presence of area 9, at the intersection 10 of the lines, enables the conductivity to be locally reduced thereby locally modifying the electrochemical deposition rate.

The part of the face of the photovoltaic cell designed to be electrically connected with the second line thus comprises regions of different electric conductivities, before electrochemical deposition is performed, the conductivity of area 9 being strictly lower than the electric conductivity of the rest of said part of the face. This then makes it possible to respectively form two different types of electric coupling in said part of the face of the cell, with the electrochemical bath.

Thus, when electrochemical deposition takes place, the electrically conducting material designed to form electric contact 8 will be preferentially and more rapidly deposited on the region having the higher electric conductivity.

This enables the growth rate of electric contact 8 to be locally mastered, at the level of the intersection of lines 4 and 5, when electrochemical deposition takes place. It is also possible to master the place where the electrically conducting material of electric contact 8 will preferentially be deposited and therefore to locally master the thickness of electric contact 8.

In the case where area 9 is not completely insulating, the electrically conducting material can deposit on said area 9 at a limited rate compared with the rate of deposition of the electrically conducting material on the rest of the face of the photovoltaic cell, as conduction of the electrons involved in the electrochemical deposition is more difficult.

Area 9 and the portion of electrically conducting material arranged on area 9 can then be removed by etching for example.

According to a preferred embodiment, area 9 is electrically insulating. The material constituting said area 9 is thus an electrically insulating material—its electric conductivity is zero or close to zero so as to considerably modify the active surface of second line 5 at the level of intersection 10 of the lines and to prevent electrochemical deposition at the level of area 9. The electric coupling between the part of the face of the photovoltaic cell, at the level of area 9, and the electrochemical bath is then nil and there is no metal deposition on area 9, during the electrochemical deposition step.

Advantageously, in the case of an electrically insulating area 9, the active surface will be the same throughout deposition and the method will be better mastered. The presence of insulating area 9 enables the electrically active surface of the photovoltaic cell designed to be covered by second line 5 to be modified when electrochemical deposition takes place. What is meant by electrically active surface is the surface available for electrochemical deposition, i.e. the surface which is in contact with the electrolytic bath when deposition takes place, for transfer of the electrons. The electrolytic bath contains metallic ions in solution which will serve the purpose of formation of electric contact 8. By reducing the electrically active surface, the deposition conditions are modified; the current density is increased on second line 5 as the total current used when deposition is performed is distributed over a reduced electrically active surface.

Furthermore, on account of the fact that area 9 is arranged on the line of larger width, i.e. on second line 5, the current density difference between the lines at the level of their intersection 10 is minimized. The thickness of electric contact 8 will be more homogenous both at the level of intersection 10 of lines 4 and 5 and over the length of line 5 of second width. The bottleneck in terms of line resistance is thus lessened and the performances of photovoltaic cell 1 are improved.

The metallization method enables more homogenous electric contacts to be obtained between lines 4 and 5 in comparison with a method comprising electrochemical deposition on a substrate not comprising an area 9.

Figure 4:
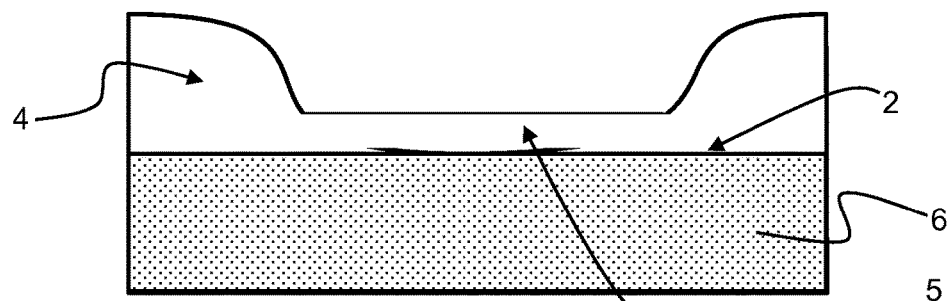
FIG. 4 represents the intersection of two metal lines on the main face of a substrate, in schematic manner and in cross-section along the plane AA' of FIG. 2, FIGS. 6 to 9 represent a photovoltaic cell according to a first particular embodiment, in schematic manner and in cross-section along the plane BB' of FIG. 3, during the different steps of the production method of the photovoltaic cell.

Indeed, as represented in FIG. 4, without the presence of area 9, the thickness of electric contact 8 on line 5 of second width is smaller than the thickness of lines 4 of first width. In addition, lines 4 of first width present a non-uniform thickness: close to line 5 of second width, line 4 of first width is thinner, which results in formation of a bottleneck in terms of line resistance thereby reducing the performances of the photovoltaic cell. In the case of the method comprising an area 9, the performances of the photovoltaic cell are improved as the line resistance at the level of the contacts is lower.

What is meant by line resistance is the resistance proper to the thickness of the line.

What is meant by bottleneck is a narrower section for current flow. This can for example involve a smaller line thickness, which locally causes an increase of the resistance and a reduction of the performances of photovoltaic cell 1. Furthermore, the line widths can be increasingly smaller and the cost of the cells is reduced.

Area 9 is thus formed by an electrically insulating material such as silicon nitride, silicon oxide or organic resins which may be photosensitive or not.

Area 9 is advantageously produced at the same time as mask 7 from the same insulating material—area 9 is formed by a part of said mask 7. It is formed for example by a resin deposited on substrate 6, said resin being exposed so as to form the patterns of mask 7 and so as to form at least one insulating area 9.

Preferentially, area 9 is in the form of a pillar having in particular a square, rectangular or circular cross-section. These basic shapes are advantageously easier to achieve than more complex shapes. Preferentially, the base of the pillar is of circular shape in order to reduce spike effects.

The surface of the base of area 9 is comprised between $0.1w^2$ and $10w^2$, w being the width of the first line, i.e. between 0.1 times and 10 times the squared width of first line 4.

Figure 5:
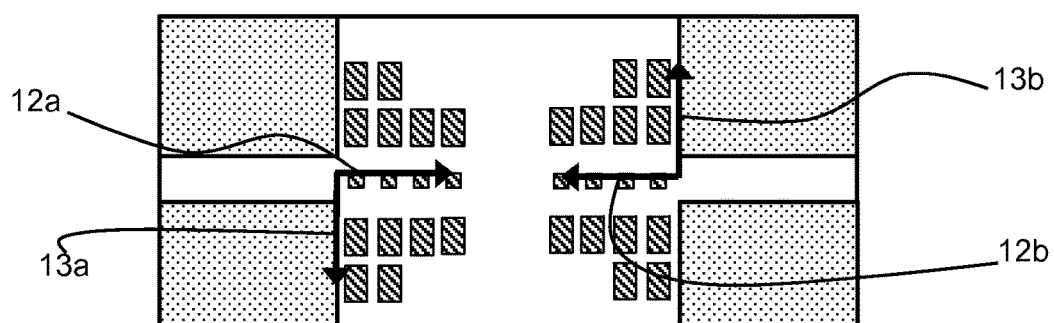

As represented in FIGS. 3 and 5, second line 5 preferentially comprises several areas 9. Different arrangements and different surface densities in areas 9 on second line 5 can thus be envisaged. It is thus easier to locally control the thickness of electric contact 8.

As represented in FIG. 5, the lines of first width 4 and second width 5 advantageously define an orthonormal coordinates system (O, x, y), O being the origin of the coordinates system and corresponding to the point situated in the middle of first line 4 and to the intersection of first line 4 and second line 5 in the extension of a lateral face. The x-axis 12a and 12b is parallel to the longitudinal axis of first line 4 and passes through the middle of the latter. It starts from the intersection 10 between the lines and is directed towards the inside of second line 5. The y-axis 13a and 13b is parallel to the longitudinal axis of second line 5 and is situated on the edge of second line 5. As represented in FIG. 5, y-axis 13a and 13b can be oriented in two different directions. The x and y axes are parallel to main face 2 of photovoltaic cell 1.

Area or areas 9 are preferentially arranged in a perimeter delineated by the points of coordinates (0, −10w), (0, 10w), (10w, 10w) and (10w, −10w), the point of coordinates (0, 0) corresponding to the point situated in the middle of first line 4 and to the intersection of first line 4 and second line 5, w corresponding to the width of first line 4 along the axis y. Said area 9 is situated in proximity to intersection 10 of the lines, and more particularly within the perimeter described above.

Area or areas 9 thus have a remarkable effect on the thickness of the lines at the level of intersection 10. Areas 9 could however be located outside the perimeter to control the thickness of second line 5 over a larger surface.

Areas 9 can be distributed in the perimeter in asymmetric or symmetric manner. The symmetry is defined for example with respect to a plane perpendicular to the surface supporting the lines, located in the middle of the line of first width 4 and/or with respect to a plane located in the middle of the line of second width 5. The areas are arranged in controlled manner in order to master the surface current and therefore the thickness obtained at the junction of the lines of first and second widths. The height of electric contact 8 is thus more uniform in proximity to the intersections where the metallized surface is large compared with the width of the line.

The total surface occupied by second areas 9 depends on the width of first 4 and second 5 lines. The surface of areas 9 and their distribution enable the thickness of electric contact 8 to be controlled and also influence the electric properties of the lines in terms of resistance for example. Thus, if areas 9 are distributed to form a too dense area and/or if the occupied surface is too large, the resistivity of lines 5 will increase and the cell efficiency will therefore decrease. On the other hand, if the density is too low and the surface is too small, the active surface when deposition is performed will not decrease sufficiently and lines 4 will present large bottlenecks which will increase the line resistance. Advantageously, a surface comprised between $0.1w^2$ and $10w^2$ enables interesting electric performances to be obtained.

The thickness of electric contact 8 is advantageously smaller than the thickness of mask 7. The thickness of electric contact 8 is preferably comprised between 2 μm and 100 μm, and preferably between 10 μm and 40 μm.

Electric contact 8 is deposited by electrochemical deposition (known under the abbreviation ECD). Electric contact 8 can for example be made from nickel, silver, copper, tin or one of their alloys. According to a preferred embodiment, electric contact 8 is made from copper. Advantageously the use of copper rather than silver for example enables the production costs of photovoltaic cell 1 to be reduced.

In the case of use of an electric contact 8 made from copper and of a photovoltaic cell 1 made from silicon, a barrier layer will advantageously be arranged between said electric contact 8 and the silicon of photovoltaic cell 1 in order to prevent diffusion of the copper into the silicon thereby leading to contamination of the silicon.

As represented in FIGS. 6 to 12, if substrate 6 is not sufficiently electrically conducting for easy deposition of electric contact 8 by electrochemical means, for example in the case where the front side of photovoltaic cell 1 is electrically insulating, the production method of photovoltaic cell 1 comprises a deposition step of an electrically conducting metallic layer 11 on substrate 6, before electrochemical deposition of electric contact 8, to activate the electrochemical deposition. This metallic layer 11 corresponds to a layer called activation layer which is also referred to as seed layer.

Likewise, if the surface of photovoltaic cell is electrically insulating, a deposition step of a metallic layer 11 is performed before electrochemical deposition to activate electrochemical deposition.

According to another particular embodiment, the surface of the photovoltaic cell can be electrically conducting, but electric contact 8 has difficulty in adhering to the face of the cell. An intermediate metallic layer 11 can then be deposited on the face of the cell before deposition of electric contact 8 in order to facilitate deposition of said contact.

This step is preferentially performed by electroless deposition. The electroless deposition is performed by wet method without using any electric current. It is based on the presence of a reducing agent in solution to reduce metallic ions. Such a deposition can thus be formed on an electrically insulating surface. It may also if required be performed on an electrically conducting surface.

Metallic layer 11 deposited by electroless deposition is for example made from nickel or cobalt.

According to another particular embodiment, metallic layer 11 is deposited by spraying or by inkjet and can for example be made from copper, silver or nickel.

In the case of use of electric contacts made from copper and of a photovoltaic cell 1 made from silicon, metallic layer 11 can advantageously act as a barrier layer to prevent diffusion of the copper into the silicon thereby resulting in contamination of the silicon.

Figure 6:
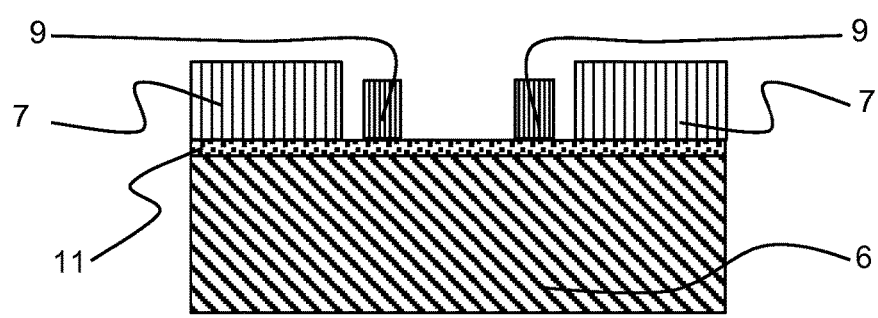

FIGS. 6 to 9 represent a first particular embodiment of photovoltaic cell 1. In this embodiment, metallic layer 11 is made before formation of mask 7 (FIG. 6). Advantageously, metallic layer 11 is formed on the whole of the face of photovoltaic cell 1 before formation of mask 7.

Formation of mask 7 and formation of area or areas 9 can be performed simultaneously or one after the other.

Preferentially, area 9 is formed at the same time as the mask, which enables areas 9 to be self-aligned with the pattern of line 5.

Figure 7:
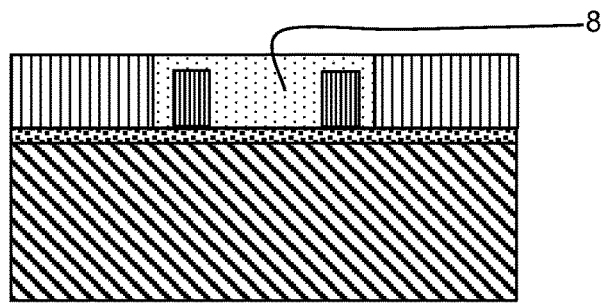
Figure 8:
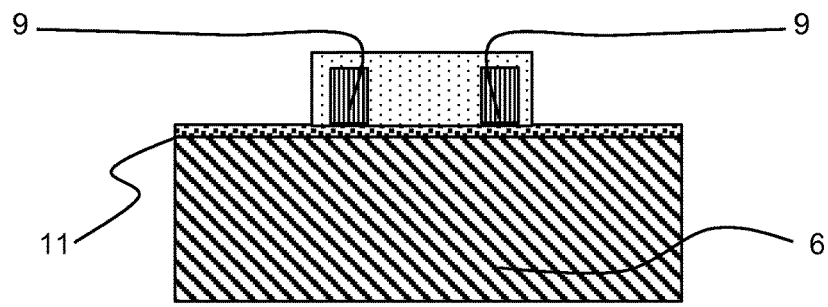

As represented in FIG. 7, electric contact 8 is then deposited on metallic layer 11 through mask 7. Finally, as represented in FIG. 8, once electrochemical deposition has been performed, mask 7 is advantageously removed.

Mask 7 can be removed by any suitable technique. This can be performed for example by chemical etching or $O_2$ plasma.

Figure 9:
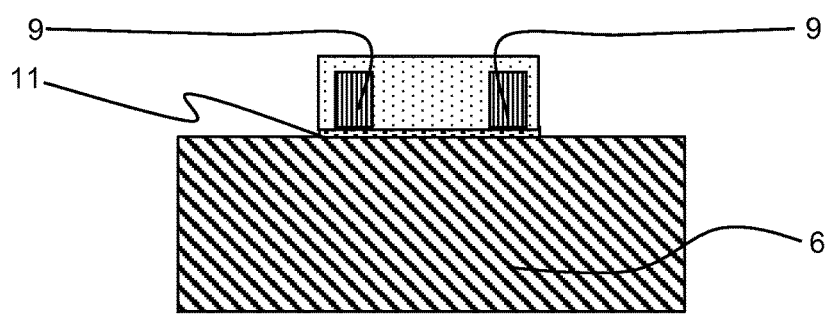

The part of metallic layer 11 that is not covered by electric contact 8 is then preferably removed (FIG. 9).

Figure 10:
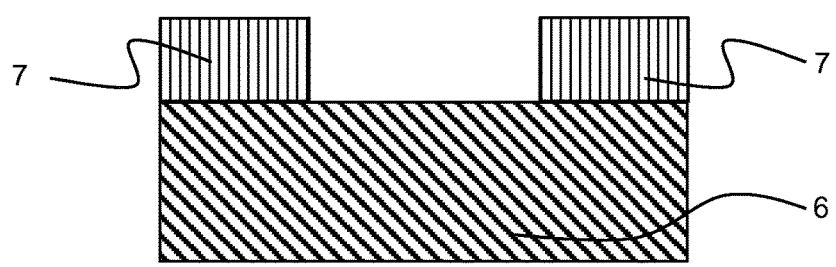
FIGS. 10 to 12 represent a photovoltaic cell according to a second particular embodiment, in schematic manner and in cross-section along the plane BB' of FIG. 3, during the different steps of the production method of the photovoltaic cell
Figure 11:
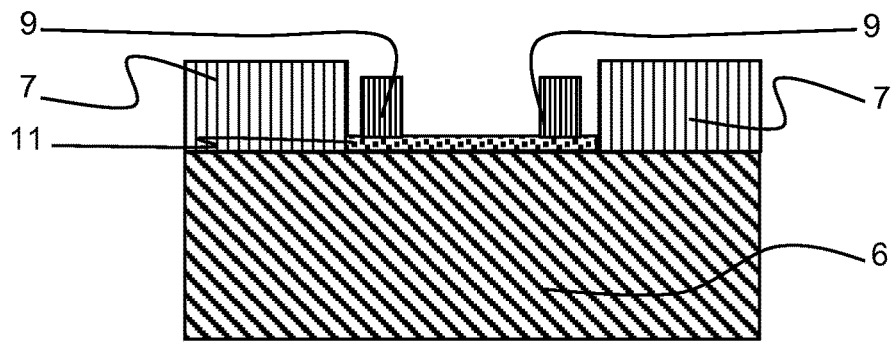
Figure 12:
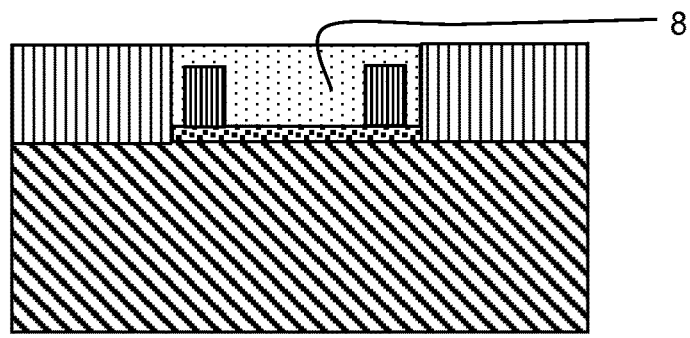

FIGS. 10 to 12 represent another embodiment wherein metallic layer 11 is formed following the formation step of mask 7 in the openings of mask 7 (FIGS. 10 and 11). Formation of area or areas 9 of first resistivity is performed after deposition of metallic layer 11 (FIG. 11). Electric contact 8 is then deposited on metallic layer 11 through mask 7 (FIG. 12). Mask 7 is then removed.

According to another embodiment, metallic layer 11 deposited on the substrate, comprises openings, i.e. pass-through holes, so as to leave a part of substrate 6 accessible. Advantageously, in the case of an insulating substrate 6, these openings in metallic layer 11 represent second areas 9.

Figure 13:
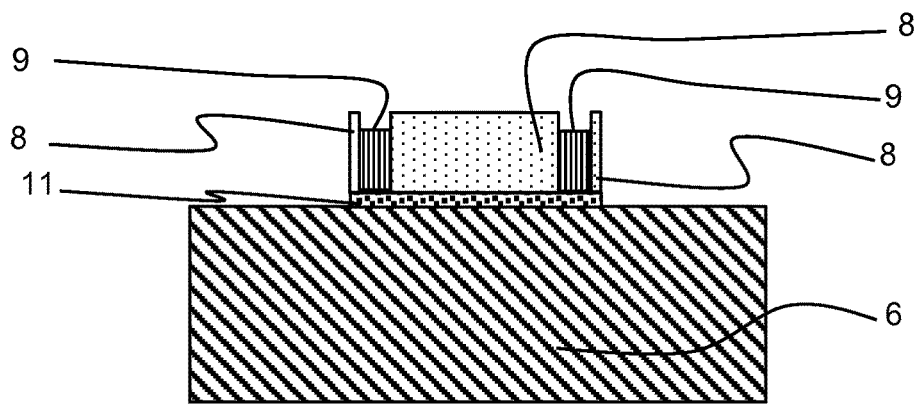
FIGS. 13 to 15 represent a photovoltaic cell according to a third particular embodiment, in schematic manner and in cross-section along the plane BB' of FIG. 3.
Figure 14:
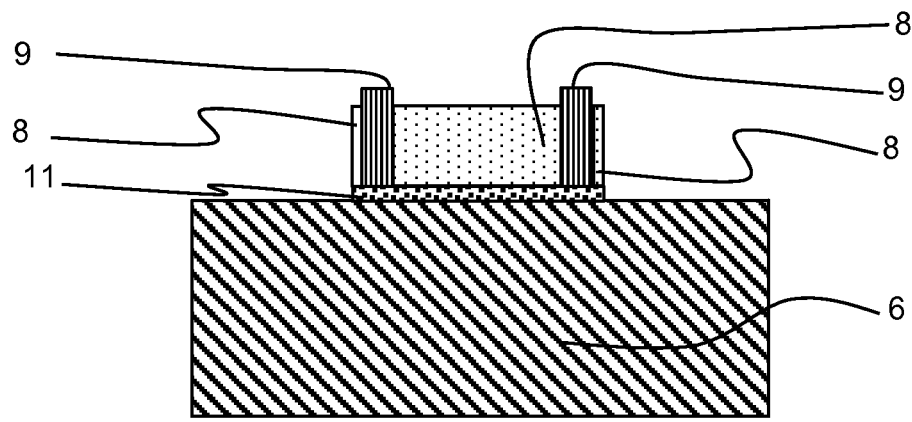
Figure 15:
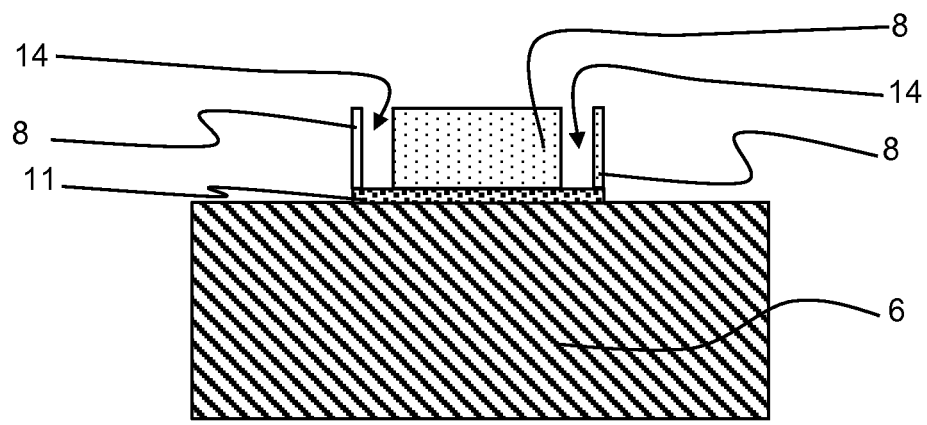

In FIGS. 7 to 9 and 12, areas 9 are completely covered by the electrically conducting material of electric contact 8. However, as represented in FIGS. 13 to 15, area 9 can have a free surface, i.e. that is not covered by the electrically conducting material of electric contact 8. This can for example be the case where the thickness of electric contact 8 is slightly larger than area 9 (FIG. 13) or the case where the thickness of electric contact 8 is smaller (FIG. 14) or equal to that of area 9.

Area 9 can be removed, for example by chemical etching or by $O_2$ plasma. Area 9 is then devoid of material. As represented in FIG. 15, area 9 is represented by a hole 14. What is meant by a hole is an empty cavity. Advantageously, this embodiment makes it possible not to have any insulating materials such as polymers, SiN or $SiO_2$ in the metallized areas.

Electric contacts 8 obtained in this way are electrically continuous but include "gaps" formed by areas 9. Electric contacts 8 thus comprise holes 14. However, the density and arrangement of holes 14 are made in such a way that the electric contacts present good electric conduction properties.

In FIGS. 6 to 15, only two areas 9 have been represented in order to make the drawings clearer. However several areas 9 of second resistivity can be used.

The embodiments describing the foregoing can be achieved alone or in combination.

Several areas 9 can be arranged at the level of intersection 10 of first 4 and second 5 lines. Areas 9 can be of different shapes and have different surfaces.

Advantageously, mask 7 comprises several lines 4 of first width and several lines 5 of second width, so as to achieve a pattern in the form of a comb and particularly a pattern in the form of a grid. A single mask can thus be used to perform metallization in the form of a grid on one of the faces 2 of photovoltaic cell 1 or on both faces of photovoltaic cell 1.

The metallic grid obtained on the front side of a photovoltaic cell 1 absorbs a part of the incident radiation, which limits the photo-generated current and reduces the efficiency of the cell. Advantageously, the grid obtained according to the invention presents less broad lines than those of conventionally obtained grids. The efficiency of a photovoltaic cell 1 obtained according to the invention is thus improved.

The method is applicable for any type of photovoltaic cells 1 using metallization by electrochemical means.

A photovoltaic cell 1 conventionally comprises:
- a substrate 6 comprising:
  - a photovoltaic junction,
  - at least one main face 2,
  - at least one electric contact 8 electrically connected with main face 2 of the substrate, said electric contact 8 being in the form of a first line 4 of first width and of a second line 5 of second width larger than the first width, first line 4 being connected to second line 5.

Photovoltaic cell 1 obtained by the different production methods described in the foregoing is then provided on at least one face of an electric contact made from electrically conducting material formed by first and second lines 4 connected to one another. The second line presents a larger width than the width of the first line. In addition, it comprises, at least in a part of its thickness and at the level of its intersection 10 with a first line, an area 9 having a lower conductivity than that of the electrically conducting material forming the electric contact. In particular, area 9 is in contact with. the face of the photovoltaic cell. Area 9 can thus be completely covered by the electrically conducting material of the electric contact or it can be partially covered or again it can be not covered by the latter.

Furthermore, in photovoltaic cell 1, the thickness of electric contact 8 of second line 5 increases in the direction of the intersection 10 between first 4 and second 5 lines. Thus, even if electric contact 8 comprises areas 9, said areas 9 being empty or full, the thickness of electric contact 8, outside these areas 9, increases towards the intersection 10 of the lines.

Area 9 is preferentially electrically insulating in order to have a large effect on modulation of the thickness of electric contact 8 at the level of the intersection of the lines.

According to a preferred embodiment, area 9 is made from an electrically insulating material, in particular silicon nitride, silicon oxide or a photosensitive organic resin.

According to another preferred embodiment, area 9 can be removed after formation of electric contact 8, electric contact 8 then comprising holes 14, i.e. empty cavities: area 9 is devoid of material. Area 9 is then representative of a cavity filled with air or with another gas.

Depending on the embodiments, the area of second resistivity is therefore a thinner area of line 5, a hole in the electrically conducting material of the electric contact or another material surrounded by the electrically conducting material of electric contact 8.

First 4 and second 5 lines are advantageously perpendicular to one another and define a T or a cross. It is also possible to form an L. In more general manner, passage from a first line 4 to a second line 5 involves the use of one or more areas 9 which define one or more areas of second resistivity after formation of the electric contact.

Area 9 is arranged in a perimeter delineated by the points of coordinates (0, −10w), (0, 10w), (10w, 10w) and (10w, −10w), the point of coordinates (0, 0) corresponding to the point situated in the middle of first line 4 and to the intersection of first line 4 and second line 5, and w corresponding to the width of first line 4.

The surface of area 9 is comprised between 0.1 times and 10 times the squared width of first line 4.

The electrically conducting material forming electric contact 8 is made from silver, copper, nickel, tin or one of their alloys.

Preferentially, electric contact 8 is made from silver or from copper in order to have a higher conductivity.

The width of first line 4 is advantageously comprised between 5 μm and 100 μm and the width of second line 5 is advantageously comprised between 0.1 mm and 1.5 mm in order to have a reduced shadow factor.

The invention claimed is:

1. A photovoltaic cell provided on at least one face with an electric contact made from electrically conducting material and formed by first and second lines connected to one another, the second line presenting a larger width than the width of the first line,
   wherein the first line and the second line comprise, at least in a part of its thickness and at the level of the intersection of the lines, an area having a lower conductivity than that of the electrically conducting material, the area having a lower conductivity in the second line being greater in size than the area having a lower conductivity in the first line,
   wherein the first line and the second line are not superposed on one another and are formed by the electrically conducting material, and
   wherein the first line crosses the second line in a plane parallel to the face of the photovoltaic cell.

2. The photovoltaic cell according to claim 1, wherein the area is made from electrically insulating material.

3. The photovoltaic cell according to claim 1, wherein the organic resin is photosensitive.

4. The photovoltaic cell according to claim 1, wherein the width of the first line is between 5 μm and 100 μm and the width of the second line is between 0.1mm and 1.5mm.

5. The photovoltaic cell according to claim 1, wherein the first and second lines are in a same plane parallel to the at least one face.

6. The photovoltaic cell according to claim 1, wherein said area is completely surrounded by said electrically conducting material in a plane parallel to the at least one face.

7. The photovoltaic cell according to claim 6, wherein the surface of the area is comprised between 0.1 times and 10 times the squared width of the first line.

8. The photovoltaic cell according to claim 1, wherein said area has a face opposite to the at least one face, the face of said area being not covered by said electrically conducting material.

9. A method for producing a photovoltaic cell comprising at least one electric contact, the method comprising, successively:
   providing the photovoltaic cell, the photovoltaic cell having:
     a face comprising at least first and second electrically conductive tracks connected together, the second electrically conductive track presenting a larger width than a width of the first electrically conductive track,
     a mask covering partially the face of the photovoltaic cell, the mask being configured to define the at least first and second electrically conductive tracks, the mask being formed in a material presenting an electric conductivity lower than an electric conductivity of the second electrically conductive track, at least one first area arranged at the level of an intersection between the first electrically conductive track with the second electrically conductive track, the at least one first area presenting a first electric conductivity lower than the electric conductivity of the second electrically conductive track, the at least one first area partially covers the second electrically conductive track, and at least one second area wherein the second electrically conductive track is uncovered, the at least one first area and the at least one second area are complementary areas, performing a single electrochemical deposition step of an electrically conducting material by means of an electrochemical bath electrically coupled to the first and second electrically conductive tracks so as to form first and second lines made of the electrically conducting material from the first and second electrically conductive tracks and at least one electric contact configured to connect the first and second lines to one another, the electrically conducting material having an electric conductivity greater than the first electric conductivity of the at least one first area, the electrically conducting material covering the first and second electrically conductive tracks, the second line presenting a larger width than a width of the first line, wherein the first line and the second line are not superposed on one another, wherein the at least one first area covers a surface of the second electrically conductive track designed to be in contact with the electrochemical bath, and wherein the single electrochemical deposition step is configured so that a deposition rate of the electrically conducting material on the at least one first area is lower than a deposition rate of the electrically conducting material on the uncovered second electrically conductive tracks.

10. The method according to claim 9, wherein said at least one first area is completely surrounded by said electrically conducting material in a plane parallel to the at least one face after the single electrochemical deposition step.

11. The method according to claim 9, wherein the area is formed by an electrically insulating material of at least one of silicon nitride, silicon oxide or organic resins which are photosensitive so as to avoid deposition electrically conducting material from the electrically insulating material.

12. The method according to claim 9, comprising, before the electrochemical deposition step, a formation step of a mask made from electrically insulating material of at least one of silicon nitride, silicon oxide or organic resins, on said face of the photovoltaic cell, said mask defining the first and second electrically conductive tracks.

13. The method according to claim 12, wherein the organic resins are photosensitive.

14. The method according to claim 12, wherein the mask is formed by photolithography, by screen printing or by deposition of a layer of electrically insulating material on the face of the photovoltaic cell and application of a laser beam on the face of said layer to form the openings in the layer.

15. The method according to claim 12, wherein the mask is present during the electrochemical deposition step and the mask is removed once electrochemical deposition has been performed.

16. The method according to claim 12, wherein the mask comprises at least one plot defining the at least one first area disposed inside the second electrically conductive track, the at least one plot being separated from the sidewalls of the mask defining the second electrically conductive track.

17. The method according to claim 12, wherein a deposition step of a metallic layer is performed before electrochemical deposition to activate the electrochemical deposition.

18. The method according to claim 17, wherein the metallic layer is formed on the whole of the face of the photovoltaic cell, before formation of the mask.

19. The method according to claim 17, wherein the metallic layer is formed subsequent to the formation step of the mask in the openings of said mask, and the metallic layer is formed by electroless deposition, spraying or inkjet.

20. A method for producing a photovoltaic cell comprising at least one electric contact, the method comprising, successively:

providing the photovoltaic cell, the photovoltaic cell having a face comprising at least first and second electrically conductive tracks connected together, the second electrically conductive track presenting a larger width than a width of the first electrically conductive track, forming a first material on the second electrically conductive track so as to define at least one first area partially covering the second electrically conductive track and at least one second uncovered area of the second electrically conductive track, the at least one first area being arranged at the level of an intersection between the first electrically conductive track with the second electrically conductive track, the at least one first area presenting a first electric conductivity lower than a conductivity of the second electrically conductive track, performing a single electrochemical deposition step of an electrically conducting material by means of an electrochemical bath electrically coupled to the first and second electrically conductive tracks so as to form first and second lines made of the electrically conducting material from the first and second electrically conductive tracks and at least one electric contact configured to connect the first and second lines to one another, the electrically conducting material having an electric conductivity greater than the first electric conductivity of the at least one first area, the electrically conducting material covering the first and second electrically conductive tracks, the second line presenting a larger width than a width of the first line, wherein the first line and the second line are not superposed on one another, wherein the at least one first area covers a surface of the second electrically conductive track designed to be in contact with the electrochemical bath, wherein the first line crosses the second line in a plane parallel to the face of the photovoltaic cell, and wherein said at least one first area has a first face contacting the second electrically conductive track and an opposite second face, the second face of said at least one first area being in contact with the electrochemical bath and not being covered by said electrically conducting material after the single electrochemical deposition step.

21. A method for producing a photovoltaic cell comprising at least one electric contact, the method comprising successively:

providing the photovoltaic cell, the photovoltaic cell having:

a face comprising at least first and second electrically conductive tracks connected together, the second electrically conductive track presenting a larger width than a width of the first electrically conductive track, at least one pad made of a first material and arranged at the level of an intersection between the first electrically conductive track with the second electrically conductive track, the at least one pad presenting a first electric conductivity lower than a conductivity of the second electrically conductive track, the at least one pad partially covering the second conductive track so as to define at least one first area wherein the second conductive track is covered and to define at least one second area wherein the second conductive track is uncovered, performing a single electrochemical deposition step of an electrically conducting material by means of an electrochemical bath electrically coupled to the first and second electrically conductive tracks so as to transfer electrons between the electrochemical bath and the first and second electrically conductive tracks and form simultaneously first and second lines made of the electrically conducting material from in direct contact with the first and second electrically conductive tracks and form the at least one electric contact configured to connect the first and second lines to one another, the electrically conducting material having an electric conductivity greater than the first electric conductivity of the first material, the electrically conducting material covering the first and second electrically conductive tracks, the second line presenting a larger width than a width of the first line, wherein the first line and the second line are not superposed on one another, and wherein the single electrochemical deposition step is configured so that a deposition rate of the electrically conducting material on the at least one first pad is lower than a deposition rate of the electrically conducting material on the first electrically conductive track and the second area of second electrically conductive track.

22. A method for producing a photovoltaic cell comprising at least one electric contact electrically connected with a face of the photovoltaic cell comprising successively:

providing the photovoltaic cell, the photovoltaic cell having:

a face comprising at least first and second electrically conductive tracks connected together, the second electrically conductive track presenting a larger width than a width of the first electrically conductive track, at least one pad made of a first material and arranged at the level of an intersection between the first electrically conductive track with the second electrically conductive track, the at least one pad presenting a first electric conductivity lower than a electric conductivity of the second electrically conductive track, the at least one pad partially covering the second conductive track so as to cover at least one first area of the second conductive track and to uncover at least one second area of the second conductive track, performing a single electrochemical deposition step of an electrically conducting material by means of an electrochemical bath, the electrically conducting material having an electric conductivity greater than the first electric conductivity of the first material, the single electrochemical deposition step being configured so as to electrically couple the electrochemical bath to the first and second electrically conductive tracks and transfer electrons between the electrochemical bath and the face of the photovoltaic cell comprising the first and second electrically conductive tracks so as to form simultaneously first and second lines made of the electrically conducting material in direct contact with the first and second electrically conductive tracks and the at least one electric contact configured to connect the first and second lines to one another, the second line presenting a larger width than a width of the first line, wherein the single electrochemical deposition step is configured so that a deposition rate of the electrically conducting material on the at least one first pad is lower than a deposition rate of the electrically conducting material on the first electrically conductive track and the second area of second electrically conductive track, the first line and the second line are not superposed on one another.

* * * * *